United States Patent [19]

Baum et al.

[11] Patent Number: 5,686,206
[45] Date of Patent: Nov. 11, 1997

[54] METHOD FOR THE REPAIR OF LITHOGRAPHIC MASKS

[75] Inventors: Thomas Hall Baum, San Jose; Paul Brian Comita, Menlo Park; Frank M. Schellenberg, Cupertino, all of Calif.

[73] Assignee: International Business Machines Corporation, Armonk, N.Y.

[21] Appl. No.: 342,066

[22] Filed: Nov. 18, 1994

Related U.S. Application Data

[63] Continuation of Ser. No. 72,205, Jun. 4, 1993, abandoned.
[51] Int. Cl.$^6$ ........................................... G03F 9/00
[52] U.S. Cl. .................. 430/5; 430/324; 427/558; 156/635; 156/646
[58] Field of Search .............. 430/5, 324; 427/558; 156/635, 643, 646

[56] References Cited

U.S. PATENT DOCUMENTS

| | | | |
|---|---|---|---|
| 4,260,649 | 4/1981 | Denison et al. | 427/53.1 |
| 4,609,566 | 9/1986 | Hongo et al. | 427/53.1 |
| 4,612,085 | 9/1986 | Jelks et al. | 156/643 |
| 4,624,736 | 11/1986 | Gee et al. | 156/643 |
| 4,668,528 | 5/1987 | Ehrlich et al. | 427/53.1 |
| 4,778,693 | 10/1988 | Drozdowicz et al. | 427/53.1 |
| 4,880,959 | 11/1989 | Baum et al. | 219/121.85 |
| 4,902,899 | 2/1990 | Lin et al. | 250/492.1 |
| 4,980,198 | 12/1990 | Dowben et al. | 427/53.1 |
| 5,085,957 | 2/1992 | Hosono | 430/5 |
| 5,221,561 | 6/1993 | Fliestein et al. | 427/534 |

FOREIGN PATENT DOCUMENTS

| | | |
|---|---|---|
| A 0165685 | 5/1985 | European Pat. Off. . |
| A-62-83749 | 9/1987 | Japan . |
| 5134395 | 5/1993 | Japan . |

OTHER PUBLICATIONS

Komano et al., "Silicon Oxide Film Formation by Focused Ion Beam (FIB)-Assisted Deposition", Japanese Journal of Applied Physics, vol. 28, No. 11, Nov., 1989, pp. 2372–2375.

Watanabe et al., "Pattern Transfer Characteristics of Transparent Phase Shifting Mask", Japanese Journal of Applied Physics, vol. 30, No. 11B, Nov., 1991, pp. 3004–3009.

Terasawa et al., "Improved resolution of an i–line stepper using a phase–shifting mask", J. Vac. Sci. Technol. B8(6), Nov./Dec. 1990.

Toh et al., "Chromeless Phase–Shifted Masks: A New Approach to Phase–Shifting Masks", A Preprint from the tenth annual symposium on microlighography of BACUS, Sep., 1990.

Schellenberg et al., "Twin Phase Edges for Linewidth Control", IBM Research Division, Almaden Research Center, 650 Harry Road, San Jose, CA 95120.

Levenson et al., "Improving Resolution in Photolithography with a Phase–Shifting Mask", IEEE Transactions on Electron Devices, vol., ED–29, No. 12, Dec. 1982.

Brock et al., "Fabrication of Grooved Glass Substrates by Phase Mask Lithography", Research Disclosure, Jan. 1991, No. 321, Kenneth Mason Publications Ltd., England.

Burggraaf, P. "Lithography's Leading Edge, Part 1: Phase–Shift Technology", Feb. 1992, Semiconductor International.

Levenson, "What IS a Phase–Shifting Mask", IBM Research Division K32/802D, 650 Harry Road, San Jose, CA 95120.

Repair System for Phase Shift Masks, IBM Tech. Disclosure Bulletin, vol. 36, No. 05, May 1993.

Laser CVD of Metals on Free–Standing Beams in Thin Film Carriers, IBM Tech. Disclosure Bulletin, vol. 33, No. 10B, Mar. 1991.

*Primary Examiner*—S. Rosasco
*Attorney, Agent, or Firm*—Robert B. Martin

[57] ABSTRACT

The present invention relates to a method for the repair of void type defects in phase-shifting optical lithography masks by depositing a transparent mateial on the defect from a gaseous precursor by ultraviolet beam-induced deposition.

5 Claims, 6 Drawing Sheets

METHOD FOR THE REPAIR OF LITHOGRAPHIC MASKS

This is a continuation of application Ser. No. 08/072,205 filed on Jun. 04, 1993, now abandoned.

FIELD OF THE INVENTION

The present invention relates to a method for the repair of phase-shifting defects in optical lithographic masks.

BACKGROUND OF THE INVENTION

Optical projection exposure tools are now widely used in optical lithography in the production of integrated circuits. The exposure tools generally comprise an electromagnetic light source, a mask and a lens. The tool functions to project the image of the mask onto the surface of a photoresist film disposed on a wafer. Because of the continuing demands for higher circuit density in integrated circuits, there is a continuing desire to improve resolution of optical lithography. One method of improving the resolution involves the use of phase-shifting masks. The phase-shifting mask generally comprises a plurality of individual transparent phase-shifting layers disposed in a pattern on a transparent substrate. Optionally, the phase-shifting mask can also be provided with opaque areas such as a chrome pattern. Light which is focused on the mask will either he reflected by the opaque chrome pattern or be transmitted through the transparent portion of the mask. The phase-shifting layer causes the transmitted light to be 180° out of phase with the light which is only transmitted through the transparent substrate, i.e. the non-phase-shifted light, resulting in coherent interaction of the combined phase-shifted and non-phase-shifted transmitted light with improved resolution. Phase shifting masks are generally fabricated using standard photolithography techniques. For example, Levenson, et al. in his article "Improving Resolution in Photolithography with Phase—Shifting Mask" IEEE Transaction on Electron Devices Vol. 29, No. 12 (December 1982), discloses fabrication of a phase-shifting mask using photolithography with poly-methacrylate as the mask material. However, occasionally during the fabrication of the phase-shifting mask, void-type defects occur in the phase-shifting layer. These defects disrupt the coherent interaction for the transmitted light and can, in some cases result in loss of resolution of the projected image on the photoresist film. Hosono's U.S. Pat. No. 5,085,957, discloses a method for the repair of void type defects in phase shifting masks involving ion beam deposition of transparent shifter material into the void defect. However, Hosono teaches this method is unsuitable due to lack of control of the thickness of the deposited material. A further unresolved problem with ion beam deposition is the implantation of reactive ions in the deposited layer which cause the mask to become less transparent. Therefore, there still is a need in the art for a method for repairing void-type defects in the phase shifting layer of phase-shifting photo-lithography masks.

It is therefore an object of the present invention to provide a method for repairing phase-shifting defects in phase-shifting masks.

Other objects and advantages will become apparent from the following disclosure.

SUMMARY OF THE INVENTION

The present invention relates to a method for repairing a phase shifting defect in a phase-shifting mask comprising the step of depositing a transparent material from a gas on the defect by ultraviolet beam-induced deposition. The deposition of transparent material into a wild-type defect in the phase-shifting layer restores the coherent interaction of the transmitted light with the resulting improved resolution of the phase-shifting mask.

The present invention also relates to a lithographic mask which has been repaired using the method of the present invention.

A more thorough disclosure of the present invention is presented in the detailed description which follows and from the accompanying drawings in which FIG. 1 is a cross-sectional view of a phase-shifting mask;

DETAILED DESCRIPTION OF THE INVENTION

Figure 1:
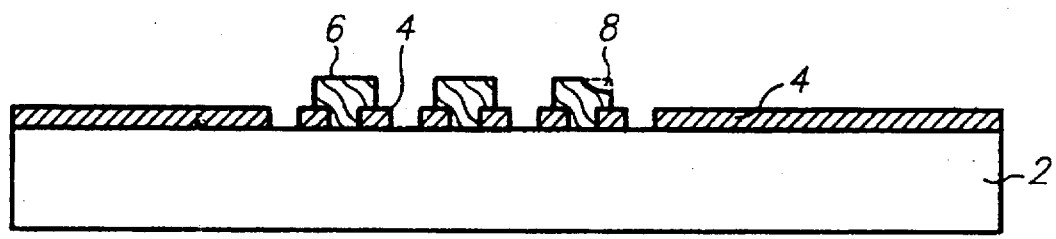

The present invention relates to a method for repairing a void-type phase-shifting defect in a phase-shifting mask comprising the step of depositing a transparent material on the defect by ultraviolet beam-induced decomposition of a gaseous precursor. Referring to FIG. 1, there is shown a phase-shifting mask comprising a transparent substrate 2, comprising material such as quartz, pyrex or, other transparent material; opaque material 4 comprising material such as chrome, gold or other metals and phase-shifting layers 6 disposed on the transparent substrate. The phase-shifting layers of the mask can be fabricated using photolithography techniques such as those disclosed in Brock, et al., "Fabrication of grooved glass substrates by phase mask lithography," J. Vac. Sci. Technol. B9,3155 (1991), the disclosure of which is incorporated herein by reference. The desired thickness (d) of the phase shifting layer can be calculated according to the formula $$d = \tau/2(n-1)$$

where n is the index of refraction of the phase-shifting layer and τ is the wavelength of the transmitted light. In such a design, the light transmitted through the phase-shifting layer will be 180° out of phase with the light which is only transmitted through the transparent substrate (the non-phase-shifted light). The phase-shifting will permit coherent interaction of the phase shifted and non-phase-shifted transmitted light with improved resolution. The coherent interaction and improvements in resolution are well known to those skilled in the art such as disclosed in Levenson et al., "Improving Resolution in Photolithography with a Phase-Shifting Mask" IEEE Transactions on Electron Devices Vol. 29, No. 12, (December 1982), the disclosure of which is incorporated herein by reference. It is generally desired to have the index of refraction of the material comprising the phase-shifting layer matching or close to the index of refraction of the transparent substrate. The mask of FIG. 1 has a void-type defect 8 in one of the phase-shifting layers. The void-type phase-shifting defect 8 in the phase-shifting layer causes incomplete phase-shifting of the light transmitted through that portion of the phase shifting layer which disrupts the coherent interaction of the transmitted light and results in a loss of resolution.

Figure 2:
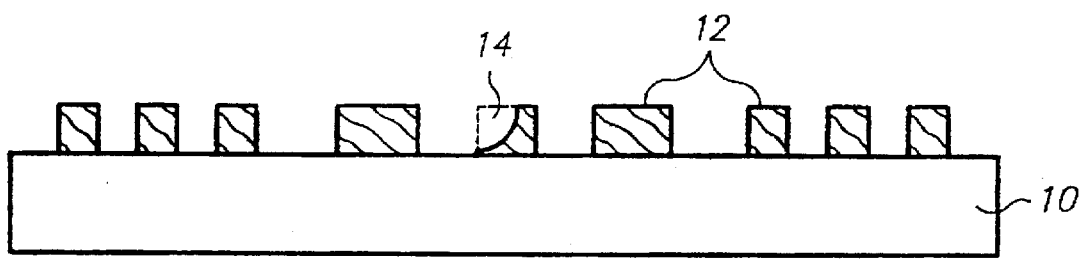
FIG. 2 is a cross-sectional view of an alternative embodiment of a phase-shifting mask.
Figure 3:
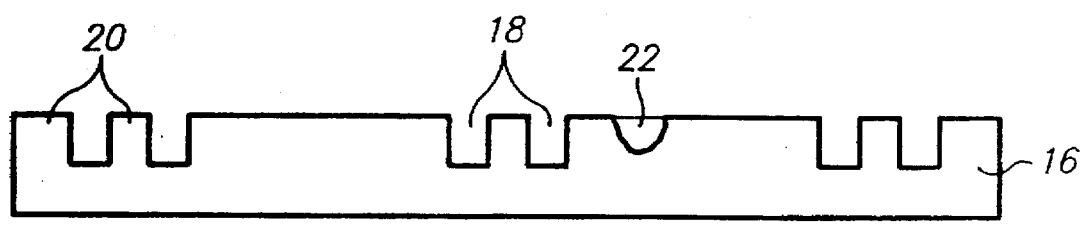
FIG. 3 is a cross-sectional view of another alternative embodiment of a phase-shifting mask.

Referring to FIG. 2, there is shown a completely transparent (chromeless) phase-shifting mask comprising the transparent substrate 10 and phase-shifting layers 12. The mask also has a void-type defect 14 in a phase-shifting layer. The void type defect 14 also disrupts the coherent interaction of the light which is transmitted through the mask to result in a loss of resolution of the mask. Referring to FIG. 3, there is shown an alternative embodiment of a completely transparent phase-shifting mask comprising a transparent substrate 16 having trenches 18 formed wherein to form phase-shifting layers 20. The mask has a wild-type defect 22 in the mask substrate or in one of the phase-shifting layers which disrupts the coherent interaction of the transmitted light and results in loss of resolution.

In the method of the present invention, phase-shifting defects 8, 14 and 22 are repaired by depositing on the defect a transparent material using an ultraviolet beam-induced deposition. Sufficient additional transparent material is deposited on the defect so that the phase shifting layer is thick enough to cause sufficient phase shifting of the light transmitted through the phase-shifting layer to enable a coherent interaction with the non-phase-shifted light to achieve improved resolution. Generally, a phase-shifting of about 180°±5° preferably about 180°±2° is desired to cause coherent interaction and improved resolution.

Suitable materials for use in the method of the present invention to repair void type defects include gaseous precursor materials which dissociate (decompose) upon exposure to a UV beam to form a solid transparent material deposited on the defect in the phase-shifting layer. The deposited solid material will preferably have an index of refraction which matches or is close to the index of refraction of the material comprising the phase-shifting layer to be repaired (e.g. for quartz about 1.5). The deposited material is suitably transparent the wavelength of the light to be utilized in the optical lithography process to form the integrated circuit. Suitable gaseous precursors include metal carbonyls, metal alkoxides and beta-diketonates, such ns chromium hexacarbonyl, tetraalkoxy silicon: tetraalkoxy titanium and trialkoxy aluminum where alkoxy is lower alkoxy e.g. ($C_{1-6}$ alkoxy) particularly methoxy, ethoxy, propoxy and butoxy. Other suitable materials will be known to those skilled in the art.

Suitable ultraviolet electromagnetic beams for inducing dissociation deposition of the transparent material have a wavelength of about 190 nm to about 400 nm preferably about 193 nm to about 248 nm and are generated by art known generators such as laser (e.g. excimer, or Nd YAG). Tile wavelength of the UV beam will depend on the nature of the gaseous precursor and desired resolution of the repair process. A preferred beam is a UV beam at 248 nm generated from an excimer laser. Tile beam may be pulsed or continuous. In order to insure the deposition of the correct amount of material onto the defect. deposition rate/time data with the UV beam and various gaseous precursors is obtained prior to the repair process.

In the method of the present invention, the phase-shifting mask with the void defect in the phase-shifting layer is placed in a chamber on an x-y translation stage. The chamber is provided with one or more quartz windows.

The location of the defect is determined using for example a microscope and the depth profile eft the defect is determined using for example a stylus profile meter. The chamber is evacuated and then filled with the desired gaseous precursor material suitably at ambient pressure. The defect is located using the microscope preferably with visible illumination. The UV beam is then focused through optical lens on the defect to cause deposition of solid transparent material onto the defect. Using the previously obtained deposition rate data, the process is continues until the desired amount of transparent material is deposited onto the defect as for example, until transparent material is deposited as shown by the dotted lines in FIGS. 1–3. The repaired phase-shifting layer causes sufficient phase-shifting of light transmitted through it to enable coherent interaction with non-phase-shifted light and result in improved resolution.

The present invention also relates to a phase-shifting mask having a phase-shifting layer which has been repaired by UV beam induced deposition of a transparent material on a phase-shifting defect. The repaired phase-shifting mask is useful in optical lithography for forming circuit patterns on integrated circuit chips.

The following examples are detailed descriptions of methods of the present invention. The detailed descriptions fall within the scope of, and serve to exemplify, the more generally described methods set forth above. The examples are presented for illustrative purposes only, and are not intended as a restriction on the scope of the invention.

EXAMPLE I

Figure 4:
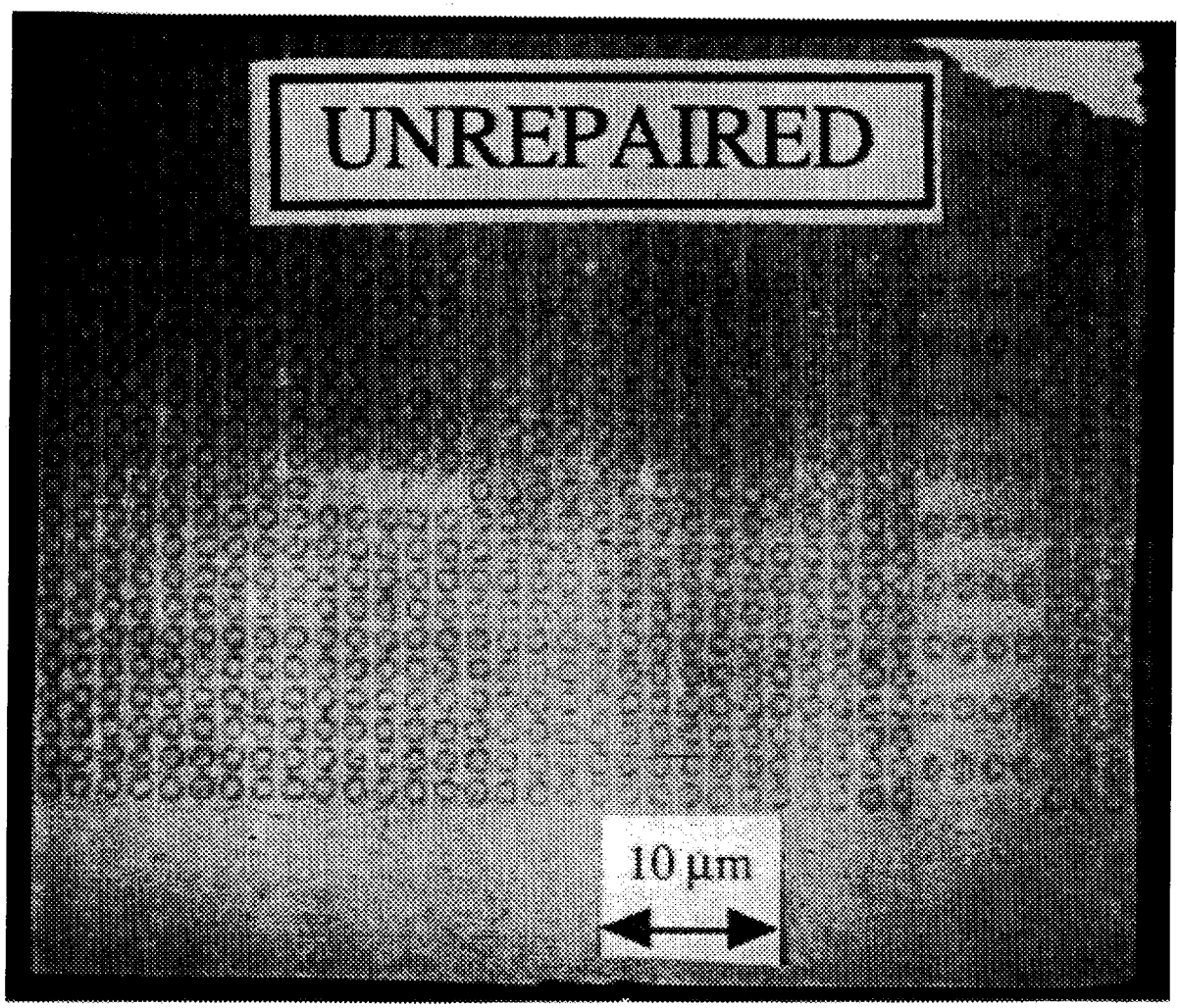
FIG. 4 is a reflection micrograph or a completely transparent phase-shifting mask with phase-shifting defect.
Figure 5:
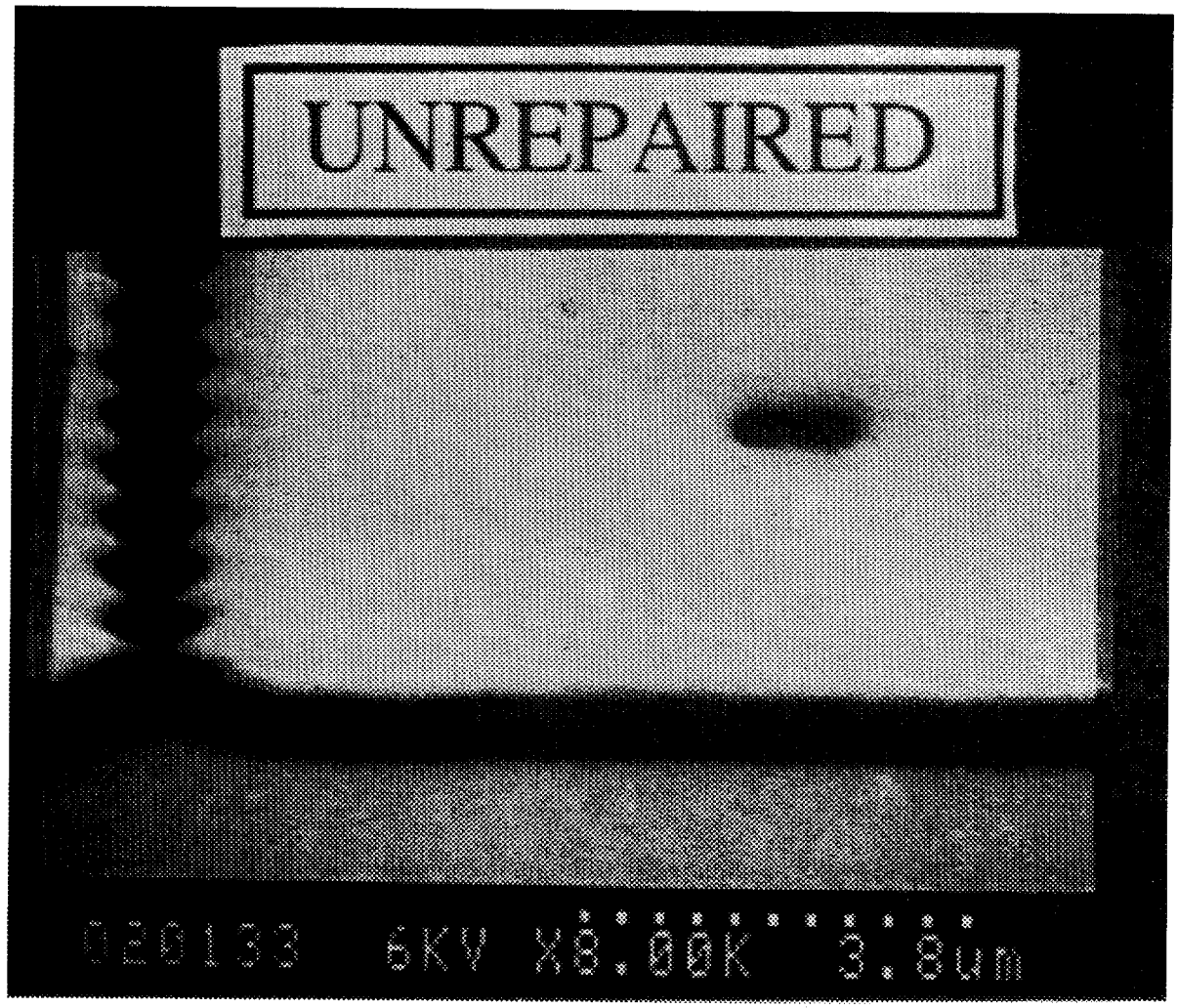
FIG. 5 is a photograph of the image in a developed photoresist with the mask of FIG. 4.
Figure 6:
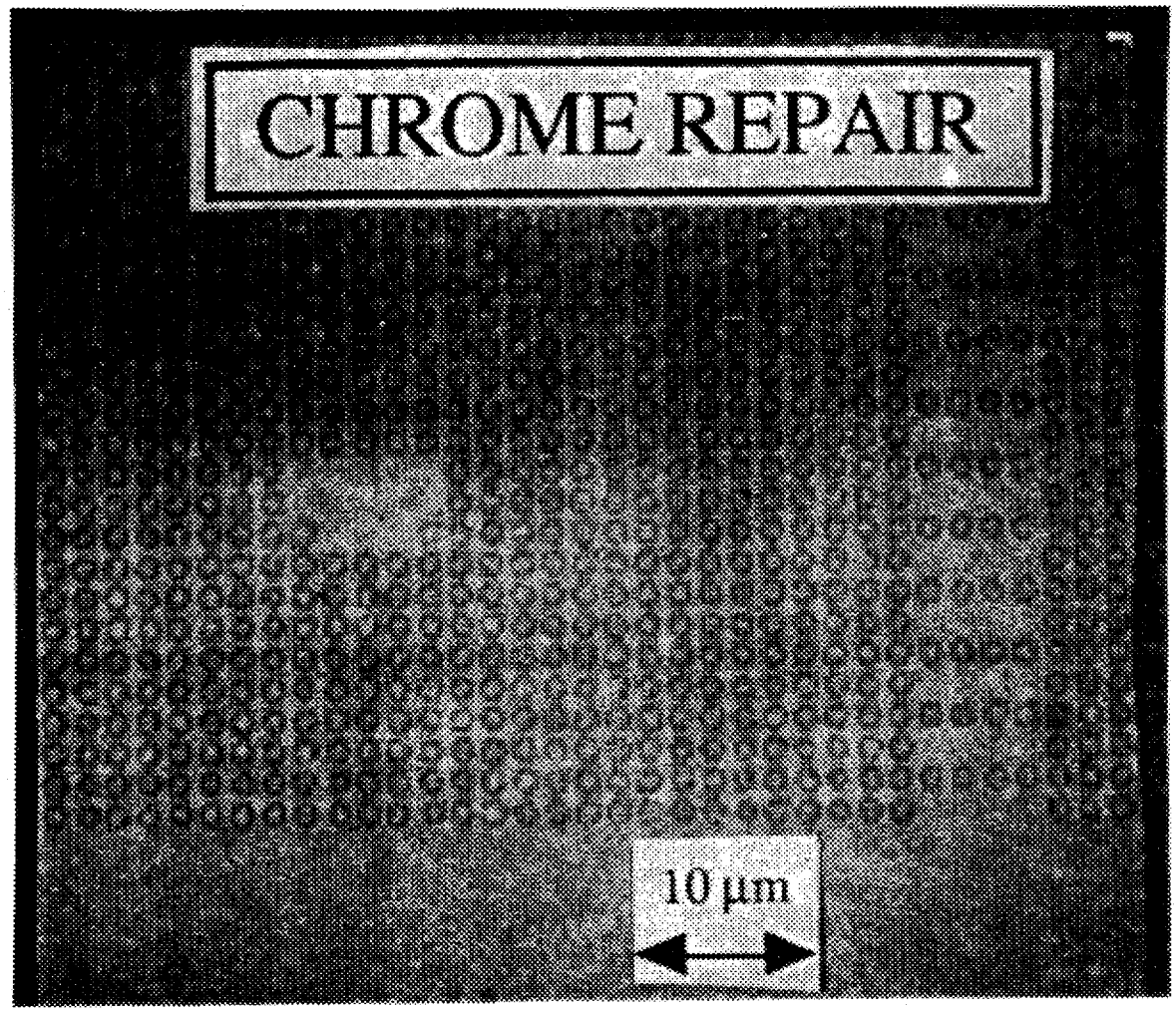
FIG. 6 is a reflection micrograph of a completely transparent repaired phase-shifting mask.
Figure 7:
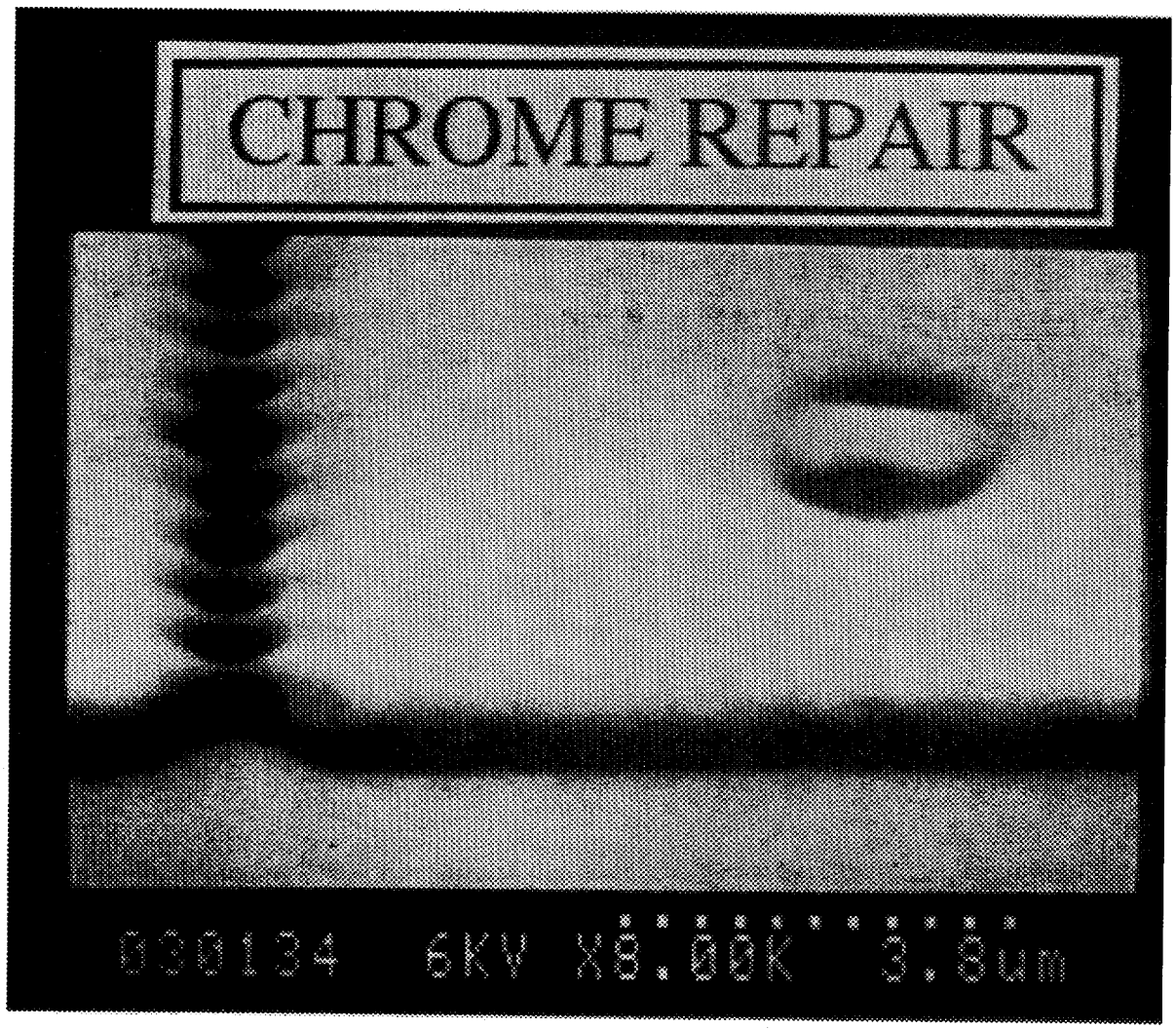
FIG. 7 is a photograph of the image in a developed photoresist with the mask of FIG. 6.
Figure 8:
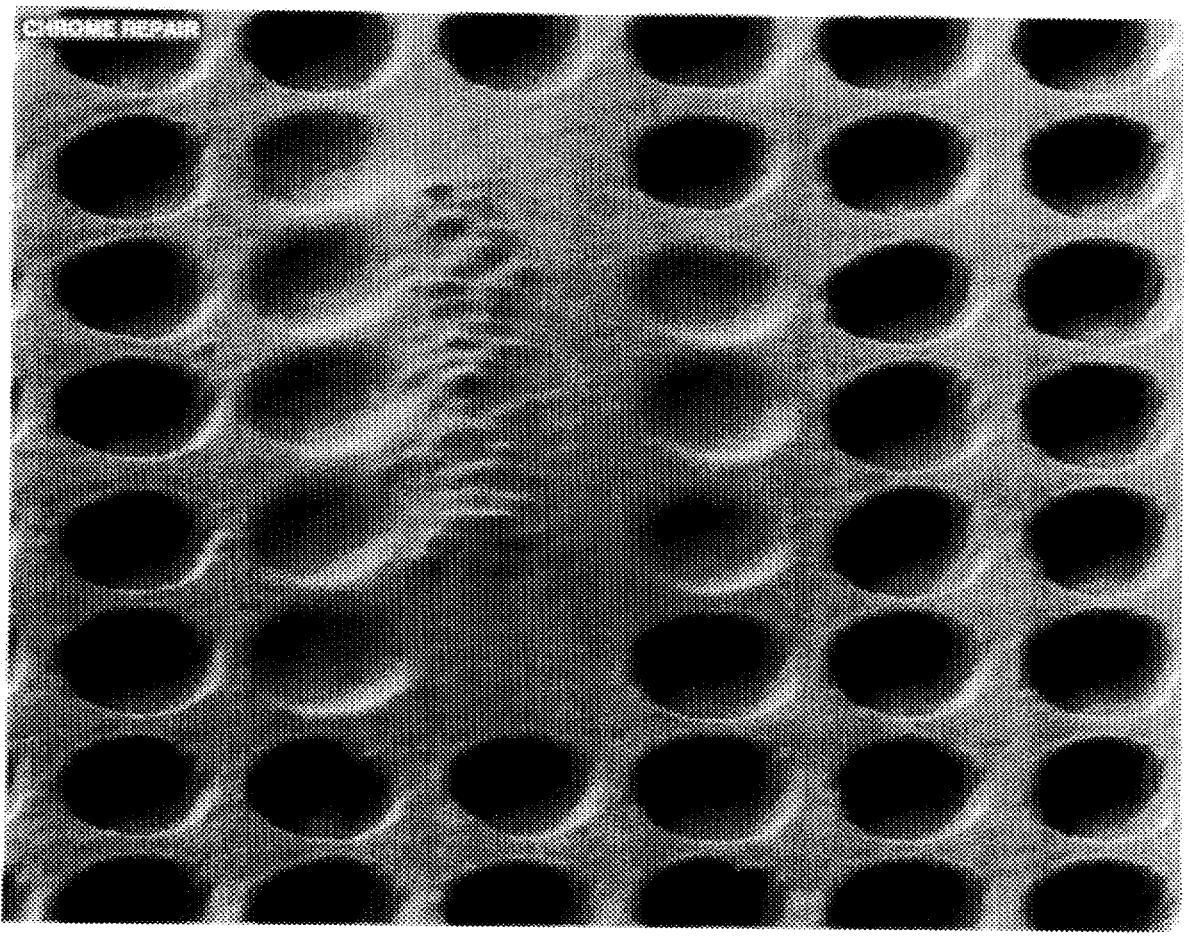
FIG. 8 is an atomic microscope photograph of the repair phase shifting mask of FIG. 6.

Referring to FIG. 4, there is shown a reflection micrograph of a completely transparent phase-shifting mask comprising a plurality of noncontiguous circular cavities formed in n quartz substrate. This mask with this dot pattern, printing opaque due to the destructive interference of the transmitted light. Parallel circuit lines can be printed by using this dot pattern mask with three rows of the dots missing (e.g. three rows of the circular cavities are filled in). The mask has one row of missing dots and therefore the phase-shifting defect comprises two rows of circular cavities which need to be filled in with transparent material. The defective mask was printed onto a photoresist coated silicon wafer with Nikon i-line 5X reduction stepper (365 nm) and FIG. 5 is a photograph of the image of the developed photoresist pattern showing that the missing row of dots (cavities) allows light through the mask to expose the photoresist. The mask was mounted as the window of a small vacuum chamber with the back side of the mask facing outward. The chamber was evacuated and filled with chromium hexacarbonyl at ambient pressure. The defect on the mask was located with a microscope using visible illumination. The defect was irradiated with an excimer laser to a total dose of 50 mJ (100 µJ/pulse, pulse width 15 n sec, 20 Hz repetition). FIG. 6 shows a reflection micrograph of the repaired mask with three rows of the circular cavities filled in. FIG. 7 is a photograph of the image of the developed photoresist pattern using the repaired mask showing parallel exposed circuit lines with an opaque region between the parallel lines. FIG. 8 is an atomic microscope photograph of the repaired mask showing the three rows of filled cavities.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A method for repairing a phase-shifting defect in the transparent portion of the phase-shifting mask comprising the steps of:
   (i) contacting the phase-shifting mask with a gaseous precursor which dissociates upon exposure to ultraviolet light, and
   (ii) focusing an ultraviolet laser-beam on the defect without focusing on an opaque portion of the mask to dissociate the gaseous precursor and deposit transparent material on the defect.

2. The method of claim 1 wherein the precursor is selected from chromium hexacarbonyl, tetraalkoxy silicon and trialkoxy aluminum.

3. The method or claim 1 wherein said beam has wavelength of about 193 to about 248 nm.

4. A method for repairing a phase-shifting defect in a chromeless phase-shifting mask comprising the step of depositing a transparent material on the defect from a gaseous precursor which dissociated upon expose to ultraviolet light by ultraviolet laser beam-induced dissociation and deposition.

5. The method of claim 4 wherein the precursor is selected from chromium hexacarbonyl, tetraalkoxy silicon and trialkoxy aluminum.

* * * * *